(12) United States Patent
Lee et al.

(10) Patent No.: US 10,128,112 B2
(45) Date of Patent: Nov. 13, 2018

(54) METHOD OF FABRICATING SEMICONDUCTOR DEVICE

(71) Applicant: Samsung Electronics Co., Ltd., Suwon-si (KR)

(72) Inventors: Cho Eun Lee, Pocheon-si (KR); Jin Bum Kim, Seoul (KR); Kang Hun Moon, Incheon (KR); Jae Myung Choe, Seoul (KR); Sun Jung Kim, Suwon-si (KR); Dong Suk Shin, Yongin-si (KR); Il Gyou Shin, Hwaseong-si (KR); Jeong Ho Yoo, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 2 days.

(21) Appl. No.: 15/595,945

(22) Filed: May 16, 2017

(65) Prior Publication Data

US 2018/0096845 A1    Apr. 5, 2018

(30) Foreign Application Priority Data

Oct. 5, 2016 (KR) .................. 10-2016-0128306

(51) Int. Cl.
| H01L 21/336 | (2006.01) |
| H01L 21/02 | (2006.01) |
| H01L 21/223 | (2006.01) |
| H01L 29/66 | (2006.01) |

(52) U.S. Cl.
CPC .. *H01L 21/02661* (2013.01); *H01L 21/02071* (2013.01); *H01L 21/223* (2013.01); *H01L 29/66545* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| 6,368,925 B2 | 4/2002 | Weon et al. |
| 7,651,948 B2 | 1/2010 | Kim et al. |
| 7,871,937 B2 | 1/2011 | Scott et al. |
| 9,466,721 B1 * | 10/2016 | Kim ............... H01L 29/785 |
| 2007/0054468 A1 | 3/2007 | Takamizawa et al. |
| 2013/0040438 A1 | 2/2013 | Adam et al. |

FOREIGN PATENT DOCUMENTS

| KR | 10-0776332 | 11/2007 |
| KR | 10-2009-0017074 | 2/2009 |

* cited by examiner

*Primary Examiner* — Jack Chen
(74) *Attorney, Agent, or Firm* — Muir Patent Law, PLLC

(57) ABSTRACT

A method of fabricating a semiconductor device is provided. The method includes forming a dummy gate electrode on a substrate, forming a trench on a side surface of the dummy gate electrode, performing a bake process of removing an impurity from the trench and forming a source/drain in the trench, wherein the bake process comprises a first stage and a second stage following the first stage, an air pressure in which the substrate is disposed during the first stage is different from an air pressure in which the substrate is disposed during the second stage, and the bake process is performed while the substrate is on a stage rotating the substrate, wherein a revolution per minute (RPM) of the substrate during the first stage is different from a revolution per minute (RPM) of the substrate during the second stage.

12 Claims, 22 Drawing Sheets

METHOD OF FABRICATING SEMICONDUCTOR DEVICE

CROSS-REFERENCE TO RELATED APPLICATION

This application claims priority to Korean Patent Application No. 10-2016-0128306 filed on Oct. 5, 2016 in the Korean Intellectual Property Office, and all the benefits accruing therefrom under 35 U.S.C. 119, the contents of which in their entirety are herein incorporated by reference.

BACKGROUND

1. Technical Field

The present disclosure relates to a method of fabricating a semiconductor device.

2. Description of the Related Art

As one of the scaling technologies to increase the density of semiconductor devices, multi-gate transistor technologies have been suggested, in which silicon bodies in a fin or nano wire shape are formed on a substrate, with gates then being formed on surfaces of the silicon bodies.

Such multi-gate transistors allow easy scaling, as they use a three-dimensional channel. Further, current control capability may be enhanced without increasing gate length of the multi-gate transistors. Furthermore, it is possible to effectively suppress a short channel effect (SCE) which is a phenomenon where the electric potential of the channel region is influenced by a drain voltage.

However, as scale-down of logic products continuously progresses, fine processes are getting more difficult due to increased aspect ratio. For example, an epitaxy process for forming a source/drain (S/D) region is sensitively affected by states of a silicon (Si) surface, and growth of silicon or silicon germanium may not properly be performed when a pre-clean of a silicon recess surface is not sufficiently performed because of modification of the aspect ratio and spacer configuration. The affected growth of silicon or silicon germanium may cause a 'less defect'. The 'less defect' may be a state in which an epitaxial growth of a silicon or a silicon germanium is not sufficient to perform a proper function in a device. For example, a source/drain pattern formed by an epitaxial growth may be smaller than an intended size, and thus may have a "less defect," also described as an "insufficiency defect." Because the less defect substantially affects a product yield, ensuring the pre-clean process is important such that the source/drain epitaxial growth is well performed. Ensuring an effective pre-bake process performed immediately before a growth process in an epitaxy chamber is also helpful to get an effective epitaxial growth.

SUMMARY

It is a technical object of the present disclosure to provide a method of fabricating a semiconductor device with improved operating performance.

The objects according to the present disclosure are not limited to those set forth above and objects other than those set forth above will be clearly understood to a person skilled in the art from the following description.

According to several aspects of the present inventive concept, there is provided a method of fabricating a semiconductor device, the method comprising forming a dummy gate electrode on a substrate, forming a trench on a side surface of the dummy gate electrode, performing a bake process of removing an impurity from the trench and forming a source/drain in the trench, wherein the bake process comprises a first stage and a second stage following the first stage, an air pressure in which the substrate is disposed during the first stage is different from an air pressure in which the substrate is disposed during the second stage, and the bake process is performed while the substrate is disposed on a stage rotating the substrate, wherein a revolution per minute (RPM) of the substrate during the first stage is different from a revolution per minute (RPM) of the substrate during the second stage.

According to several aspects of the present inventive concept, there is provided a method of fabricating a semiconductor device, the method comprising forming a dummy gate electrode extending in one direction on a substrate, forming a spacer on opposite sides of the dummy gate electrode, forming a trench by etching the substrate with the dummy gate electrode and the spacer as a mask, performing an $H_2$ bake process of removing an impurity from the trench, wherein the bake process comprises a first stage and a second stage following the first stage, and an air pressure in which the substrate is disposed during the first stage is greater than an air pressure in which the substrate is disposed during the second stage, and forming a source/drain in the trench using epitaxial growth.

According to certain aspects of the present disclosure, a method of manufacturing a semiconductor device comprises steps of forming a gate electrode pattern extending a first direction on a substrate, forming a spacer pattern extending the first direction on a side wall of the gate electrode pattern, etching a portion of the substrate to form a trench extending the first direction on a side of the spacer pattern using the gate pattern and the spacer pattern as an etch mask, cleaning the trench by removing contamination from the trench by a chemical reaction between the contamination and another reactant, and forming a source/drain pattern in the trench by an epitaxial growth, wherein the cleaning the trench is performed in a chamber, and an air pressure of the chamber changes while the cleaning of the trench is performed.

BRIEF DESCRIPTION OF THE DRAWINGS

Hereinafter, example embodiments will be explained in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g.

Figure 1:
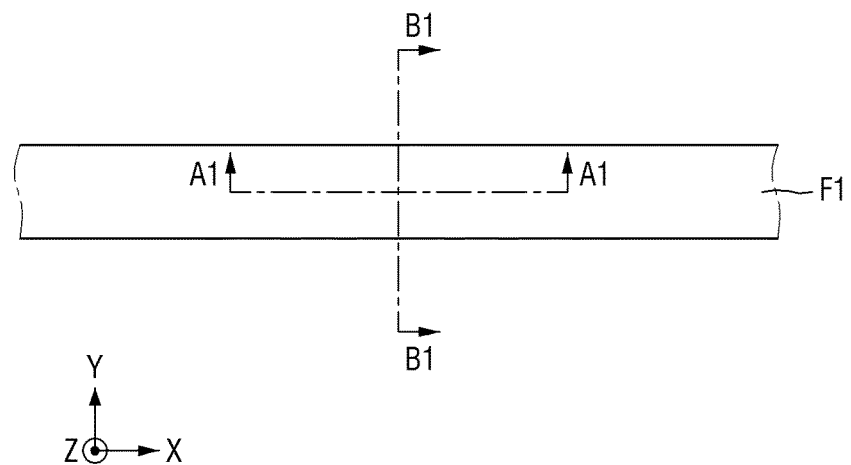

"first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of" it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present. Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

The term "air pressure" as used herein refers to a pressure of gases within a space, wherein the gasses are not necessarily composed of atmospheric "air."

Unless otherwise defined, all terms (including technical and scientific terms) used herein have the same meaning as commonly understood by one of ordinary skill consistent with their meaning in the context of the relevant art and/or the present application.

The above and other objects, features and advantages of the present disclosure will become more apparent to those of ordinary skill in the art by describing in detail exemplary embodiments thereof with reference to the accompanying drawings.

FIGS. 1 to 12 are views illustrating intermediate stages of fabrication, provided to explain a method of fabricating a semiconductor device according to some exemplary embodiments.

FIGS. 13 to 18 are views illustrating intermediate stages of fabrication, provided to explain a method of fabricating a semiconductor device according to some exemplary embodiments.

Figure 19:
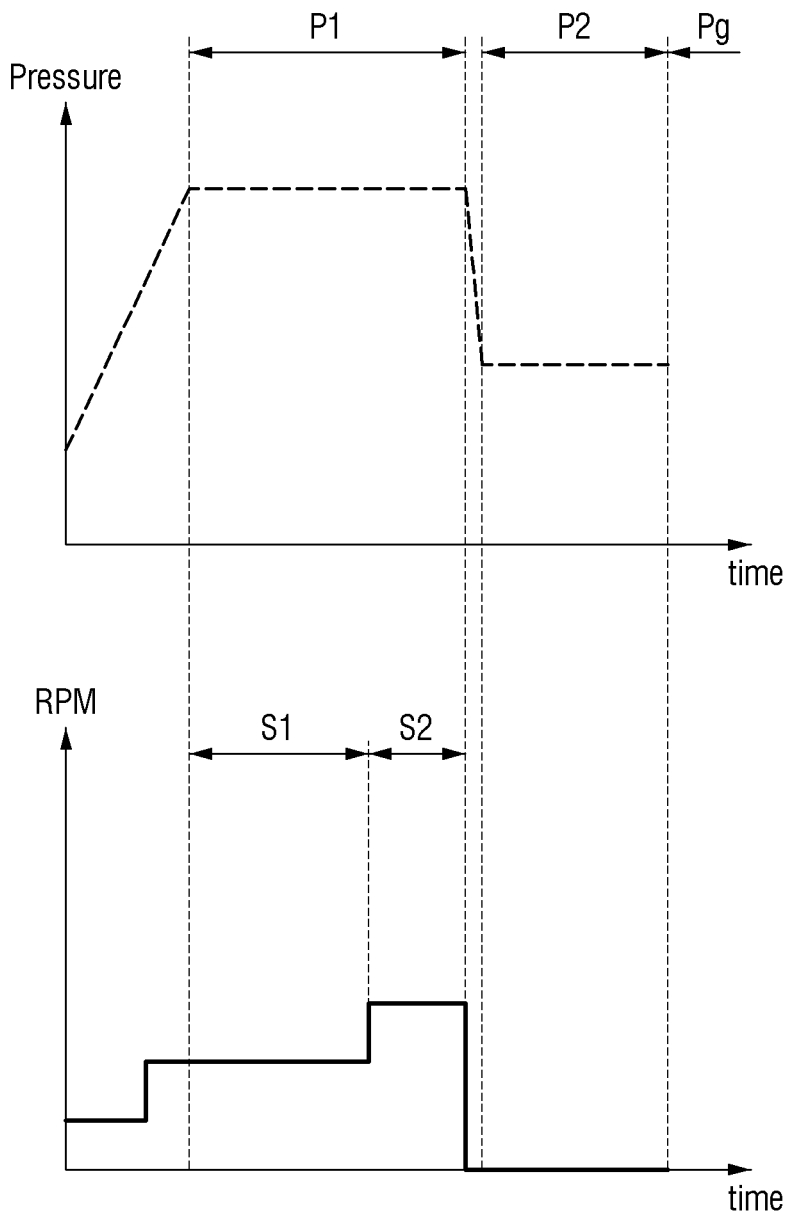
Figure 20:
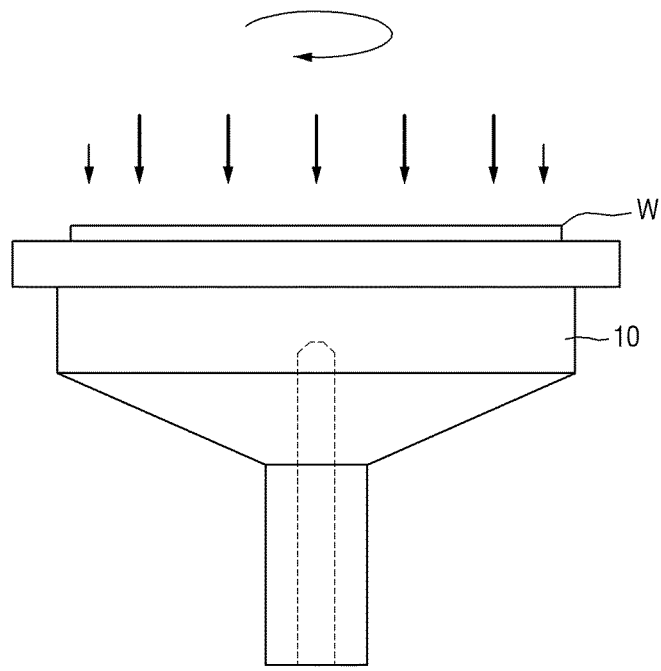

FIGS. 19 and 20 are views illustrating intermediate stages of fabrication, provided to explain a method of fabricating a semiconductor device according to some exemplary embodiments.

Figure 21:
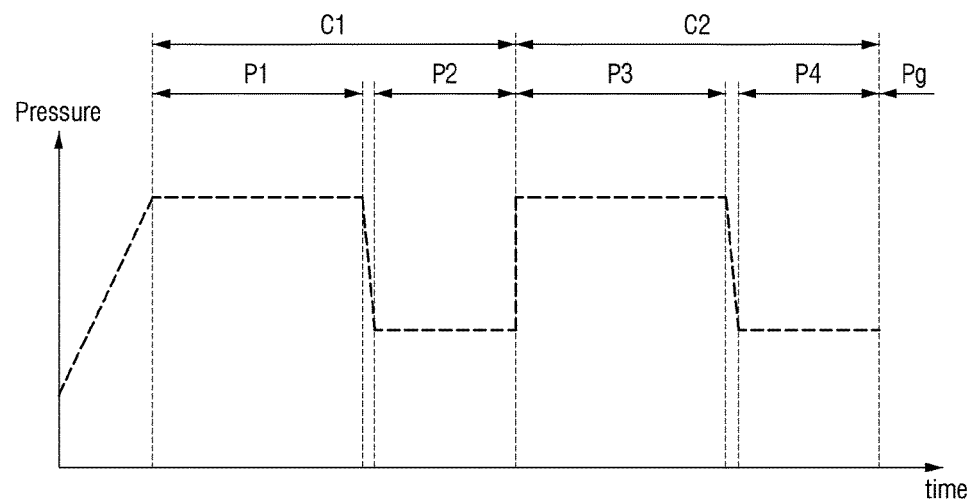

FIG. 21 is a view illustrating intermediate stages of fabrication, provided to explain a method of fabricating a semiconductor device according to some exemplary embodiments.

FIGS. 22 to 25 are views illustrating intermediate stages of fabrication, provided to explain a method of fabricating a semiconductor device according to some exemplary embodiments.

DETAILED DESCRIPTION

Hereinafter, a semiconductor device according to some exemplary embodiments will be described with reference to FIGS. 1 to 12.

Figure 2:
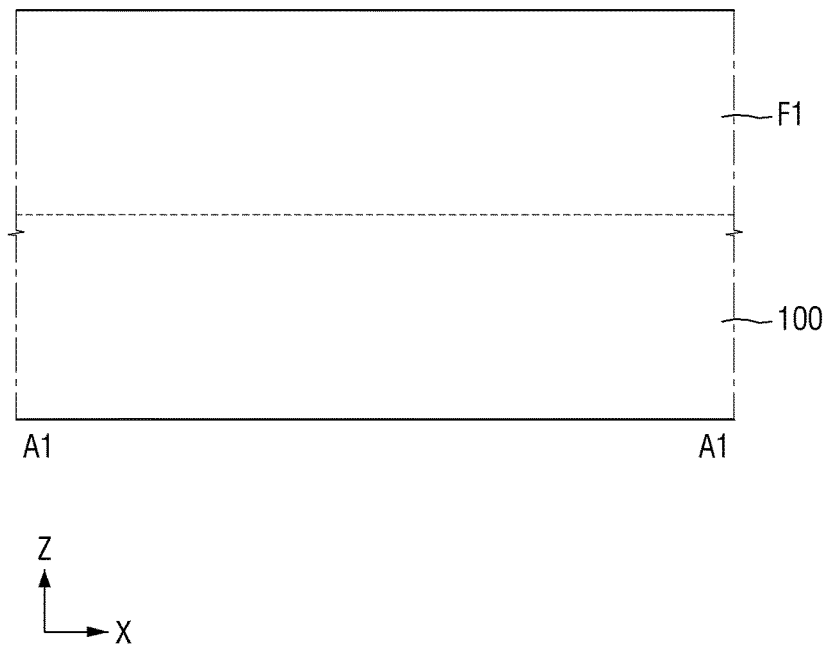
Figure 3:
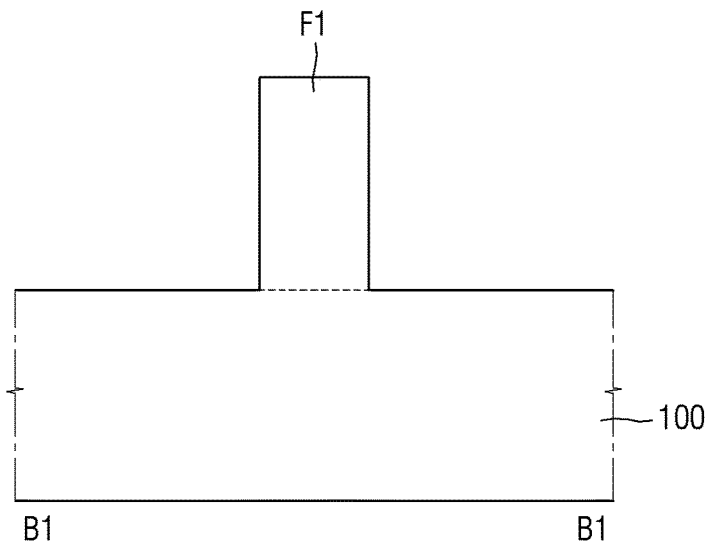
Figure 3:
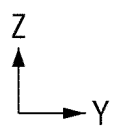
Figure 4:
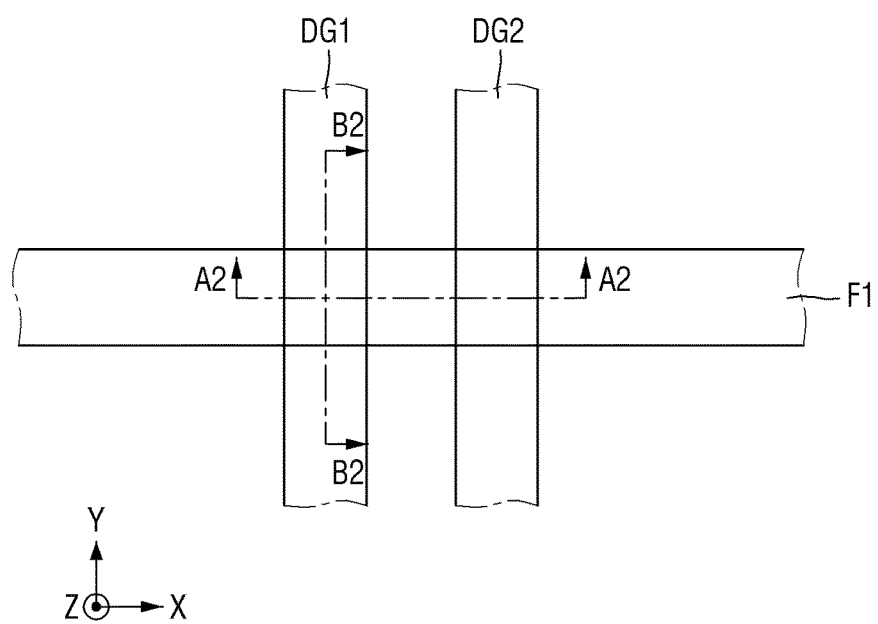
Figure 5:
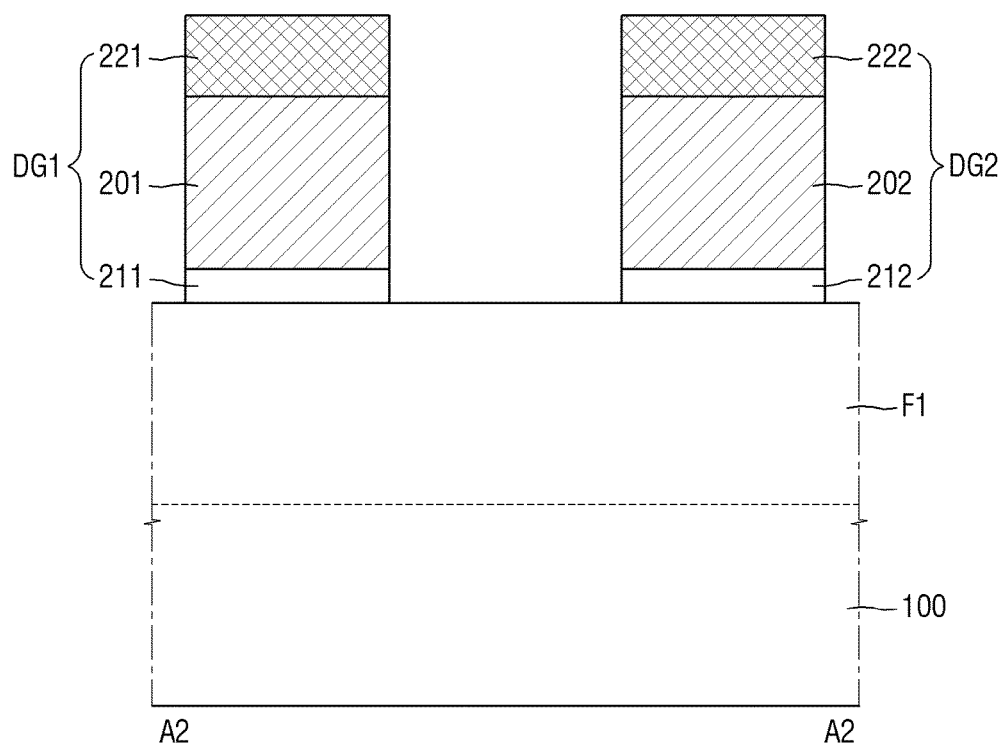
Figure 6:
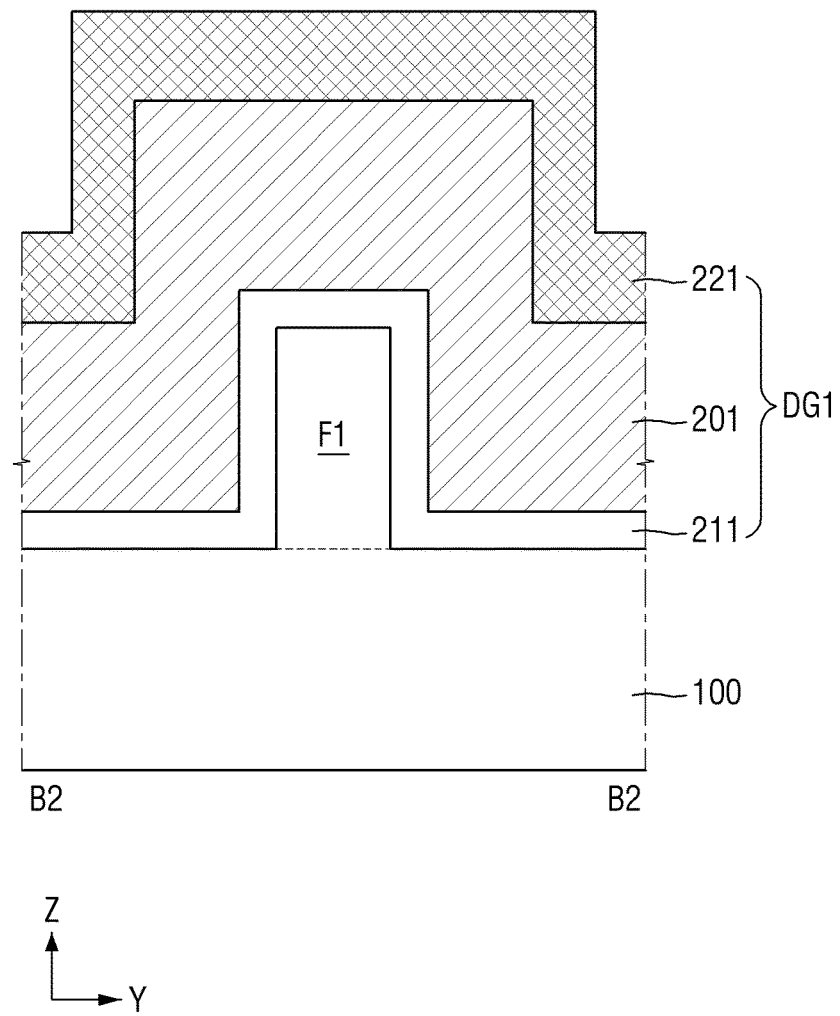
Figure 8:
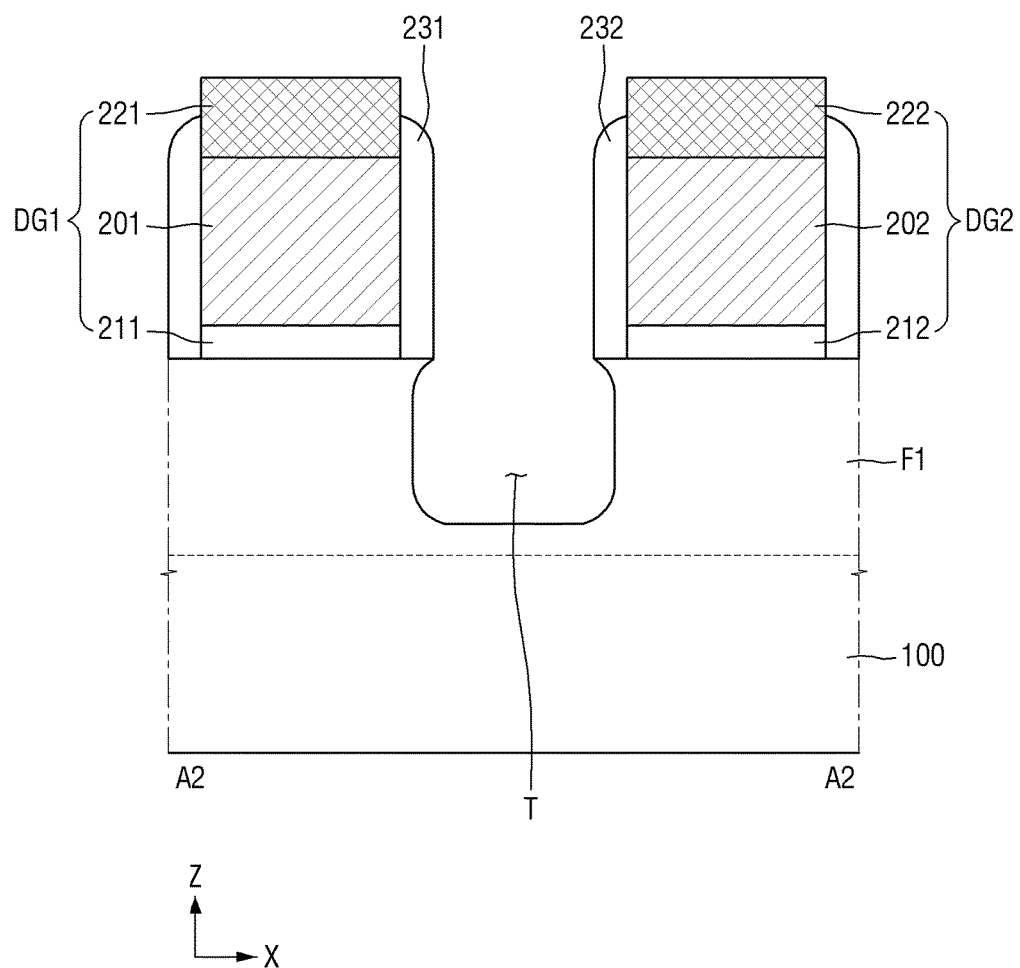
Figure 9:
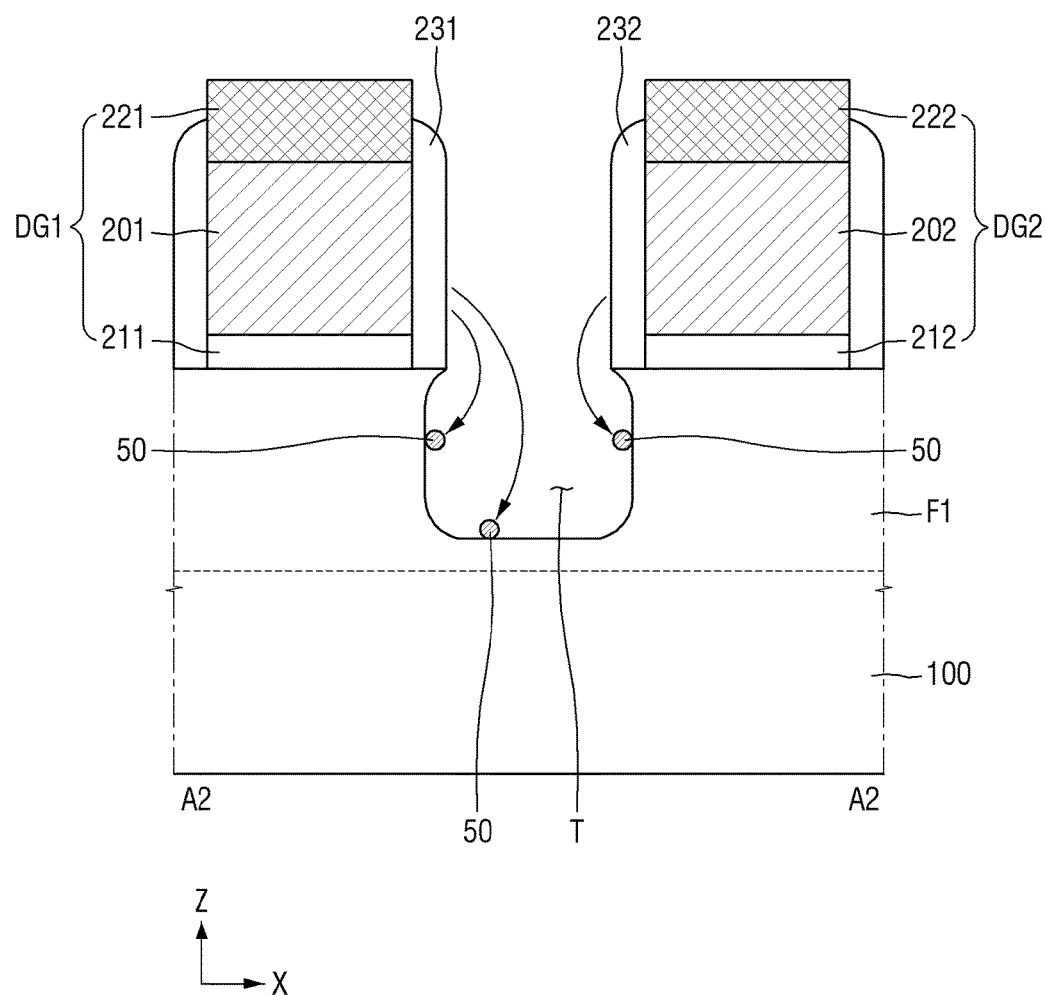
Figure 10:
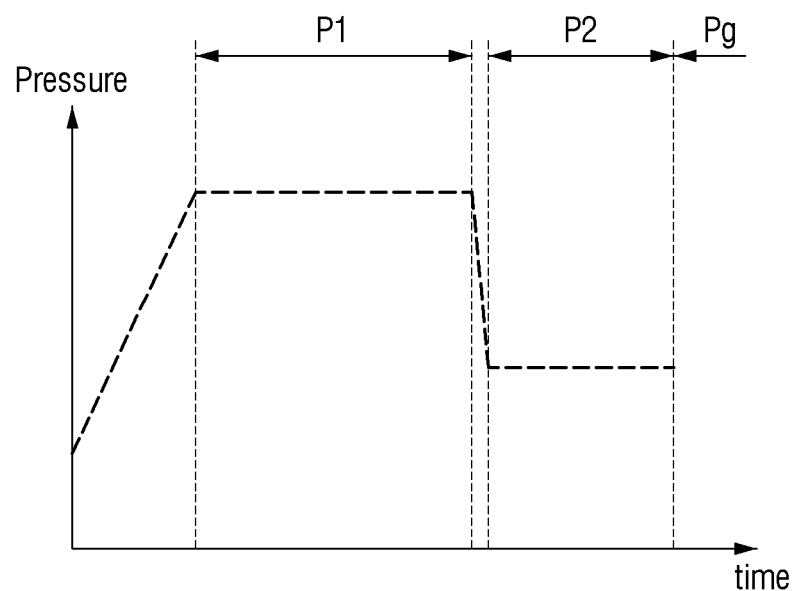

FIGS. 1 to 12 are views illustrating intermediate stages of fabrication, provided to explain a method of fabricating a semiconductor device according to some exemplary embodiments. For example, FIG. 2 is a cross sectional view taken along line A1-A1 of FIG. 1, and FIG. 3 is a cross sectional view taken along line B1-B1 of FIG. 1. FIG. 5 is a cross sectional view taken along line A2-A2 of FIG. 4, and FIG. 6 is a cross sectional view taken along line B2-B2 of FIG. 4. FIG. 10 is a graphical representation illustrating changes of pressure over time in a bake process in a method of fabricating a semiconductor device according to some exemplary embodiments. For example, the bake process may be a pre-bake process performed immediately before an epitaxial growth process of a source/drain material of a semiconductor device manufacturing method.

First, referring to FIGS. 1 to 3, the method of fabricating a semiconductor device according to some exemplary embodiments may form a fin-type pattern F1.

The fin-type pattern F1 may be formed on a substrate 100. The substrate 100 may be, for example, a bulk silicon or a silicon-on-insulator (SOI). Alternatively, the substrate 100 may include a material different from silicon, for example, silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The fin-type pattern F1 may protrude from the substrate 100. The fin-type pattern F1 may extend longitudinally in a first direction X. For example, the fin-type pattern F1 may include a long side extending in the first direction X, and a short side extending in a second direction Y. In this case, the second direction Y may be a direction that crosses the first direction X. For example, the second direction Y and the first direction X may be perpendicular to each other.

The fin-type pattern F1 may be formed by partially etching the substrate 100, and/or may include an epitaxial layer grown from the substrate 100. The fin-type pattern F1 may include an element semiconductor material such as silicon or germanium, for example. The fin-type pattern F1 may include a compound semiconductor, for example, a group IV-IV compound semiconductor or a group III-V compound semiconductor.

In an embodiment in which the fin-type pattern F1 includes a group IV-IV compound semiconductor for instance, the fin-type pattern F1 may include a binary compound or a ternary compound including at least two or more of carbon (C), silicon (Si), germanium (Ge), and tin (Sn), or the above-mentioned binary or ternary compound doped with another group IV element.

In an embodiment in which the fin-type pattern F1 includes a group III-V compound semiconductor for instance, the fin-type pattern F1 may include a binary compound, ternary compound or quaternary compound which is formed of one or more of group III elements combined with a group V element. For example, the group III elements may be at least one of aluminum (Al), gallium (Ga), and indium (In), and the group V element may be one of phosphorus (P), arsenic (As) and antimony (Sb).

In a following description, the fin-type pattern F1 of the semiconductor device according to exemplary embodiments may include silicon.

Next, referring to FIGS. 4 to 6, a first dummy gate structure DG1 and a second dummy gate structure DG2 may be formed.

The first dummy gate structure DG1 and the second dummy gate structure DG2 may be formed on the substrate 100 and the fin-type pattern F1. The first dummy gate structure DG1 and the second dummy gate structure DG2 may be formed to cross the fin-type pattern F1. The first dummy gate structure DG1 and the second dummy gate structure DG2 may each extend in the second direction Y crossing the first direction X. As described above, the first direction X may perpendicularly cross the second direction Y. Accordingly, the first dummy gate structure DG1 and the second dummy gate structure DG2 may perpendicularly cross the fin-type pattern F1.

Although not illustrated, an electrically insulating film may be formed between the substrate 100, the first dummy gate structure DG1 and the second dummy gate structure DG2. For example, the first and second dummy gate structures DG1 and DG2 may be replaced with real gate structures in a finished semiconductor device. For example, the first and second dummy gate structures DG1 and DG2 may be maintained in relatively front stages of a semiconductor device manufacturing process, and replaced by real gate structures in a rear stage of the semiconductor device manufacturing process. In certain embodiments, the first and second dummy gate structures DG1 and DG2 may include poly-silicon patterns or amorphous-silicon patterns, and the real gate structures may include metal patterns or poly-silicon patterns. For example, the dummy gate structures may undergo a source/drain implantation process, thereby being functionally deteriorated as gates of a semiconductor device. Therefore, real gate structures may replace the dummy gate structures DG1 and DG2 after an ion implantation process.

The electrically insulating film may surround at least a portion of a sidewall of the fin-type pattern F1. The fin-type pattern F1 may be defined by the electrically insulating film. For example, the substrate 100 and the fin-type pattern F1 may be distinguished from each other by the electrically insulating film. The electrically insulating film may include, for example, one of oxide film, nitride film, oxynitride film, or a combination thereof.

The sidewall of the fin-type pattern F1 may be entirely surrounded by the electrically insulating film, but not limited hereto.

The first dummy gate structure DG1 and the second dummy gate structure DG2 may respectively extend in parallel with each other. The first dummy gate structure DG1 and the second dummy gate structure DG2 may respectively extend in a same direction, e.g., the second direction Y. The first dummy gate structure DG1 and the second dummy gate structure DG2 may be spaced apart from each other in the first direction X.

The first dummy gate structure DG1 may include a first dummy gate insulating film 211, a first dummy gate electrode 201 and a first dummy gate capping film 221.

The first dummy gate insulating film 211 may be conformally formed along upper surfaces of the substrate 100 and the fin-type pattern F1. The first dummy gate insulating film 211 may include a silicon oxide film. However, exemplary embodiments are not limited to the example given above.

The first dummy gate electrode 201 may be formed on the first dummy gate insulating film 211. The first dummy gate electrode 201 may include polysilicon or amorphous silicon. However, exemplary embodiments are not limited to the example given above. The first dummy gate electrode 201, and the first dummy gate insulating film 211 may extend in the second direction Y.

The first dummy gate capping film 221 may be formed on the first dummy gate insulating film 211 and the first dummy gate electrode 201. The first dummy gate capping film 221 may not be in contact with the first dummy gate insulating film 211, and may be in contact with the first dummy gate electrode 201. The first dummy gate capping film 221 may be a silicon nitride film, but not limited hereto.

The second dummy gate structure DG2 may include a second dummy gate insulating film 212, a second dummy gate electrode 202, and a second dummy gate capping film 222.

The second dummy gate insulating film 212 may be conformally formed along upper surfaces of the substrate 100 and the fin-type pattern F1. The second dummy gate insulating film 212 may include a silicon oxide film. However, exemplary embodiments are not limited to the example given above.

The second dummy gate electrode 202 may be formed on the second dummy gate insulating film 212. The second dummy gate electrode 202 may include polysilicon or amorphous silicon. However, exemplary embodiments are not limited to the example given above. The second dummy gate electrode 202 as well as the second dummy gate insulating film 212 may extend in the second direction Y.

The second dummy gate capping film 222 may be formed on the second dummy gate insulating film 212 and the second dummy gate electrode 202. The second dummy gate capping film 222 may not be in contact with the second dummy gate insulating film 212 and may be in contact with the second dummy gate electrode 202. The second dummy gate capping film 222 may be a silicon nitride film, but not limited hereto.

The first dummy gate structure DG1 and the second dummy gate structure DG2 may be conformally formed along upper surfaces of the substrate 100 and the fin-type pattern F1. For example, the first dummy gate structure DG1 and the second dummy gate structure DG2 formed on the fin-type pattern F1 may be formed to be convex upwardly. For example, the first and second dummy gate structures DG1 and DG2 may protrude from the fin-type pattern F1 and/or from the substrate 100.

Figure 7:
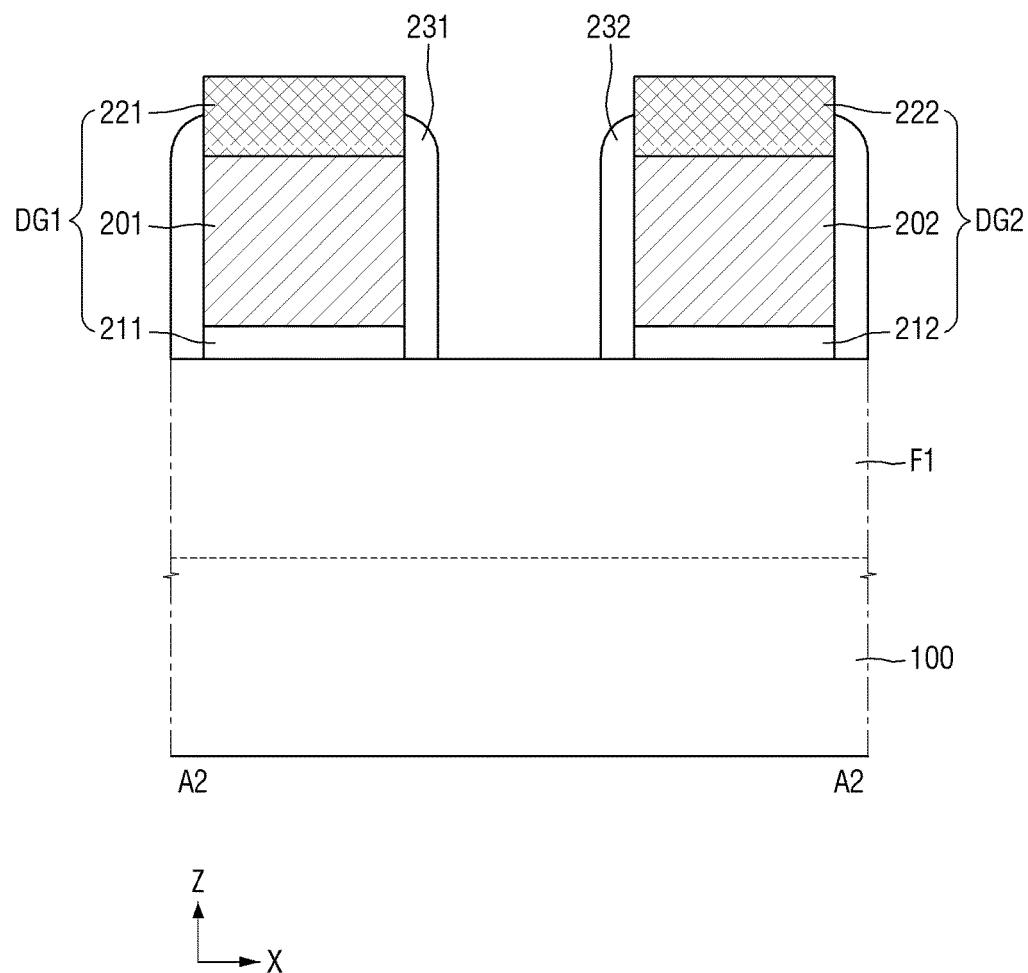

Next, referring to FIG. 7, a first spacer 231 and a second spacer 232 may be formed.

The first spacer 231 may be formed on both (e.g., opposite) sides of the first dummy gate structure DG1. For example, the first spacer 231 may include at least one of silicon nitride (SiN), silicon oxynitride (SiON), silicon oxide (SiO₂), silicon oxycarbonitride (SiOCN), or a combination thereof. However, exemplary embodiments are not limited to the example given above. The first spacer 231 may include a material having an etch selectivity to the first dummy gate structure DG1.

The first spacer 231 may cover a side surface of the first dummy gate structure DG1. For example, the first spacer 231 may entirely cover the side surfaces of the first dummy gate insulating film 211 and the first dummy gate electrode 201. On the other hand, the first spacer 231 may cover only a portion of a side surface of the first dummy gate capping film 221. However, exemplary embodiments are not limited to the example given above. For example, according to some exemplary embodiments, the side surface of the first dummy gate capping film 221 may also be entirely covered by the first spacer 231.

The second spacer 232 may be formed on both sides of the second dummy gate structure DG2. The second spacer 232 may include the same material as the first spacer 231. For example, the second spacer 232 may include at least one of silicon nitride (SiN), silicon oxynitride (SiON), silicon oxide (SiO₂), silicon oxycarbonitride (SiOCN), or a combination thereof. However, exemplary embodiments are not limited to the example given above. The second spacer 232 may also include a material having an etch selectivity to the second dummy gate structure DG2.

The second spacer 232 may cover a side surface of the second dummy gate structure DG2. For example, the second spacer 232 may entirely cover the side surfaces of the second dummy gate insulating film 212 and the second dummy gate electrode 202. On the other hand, the second spacer 232 may partially cover a side surface of the second dummy gate capping film 222. However, exemplary embodiments are not limited to the example given above. For example, according to some exemplary embodiments, the side surface of the second dummy gate capping film 222 may also be entirely covered by the second spacer 232.

The drawing exemplarily illustrates that the first spacer 231 and the second spacer 232 may each be a single film, but may be multi-spacers in which a plurality of films are stacked. Shapes of the first spacer 231 and the second spacer 232, and shapes of the multi-spacers forming the first spacer 231 and the second spacer 232 may each be an I-shape or an L-shape, or a combination thereof depending on the fabrication process or purpose of use. For example, each of the I-shape of the first and second spacers 231 or 232 may have substantially the same width between its bottom portion contacting the fin-type pattern F1 and its upper portion, e.g., a portion correspondingly contacting the first and second dummy gate electrodes 201 and 202. For example, the bottom portion of the corresponding first and second spacers 231 and 232 may be at the same height as the corresponding one of the first and second dummy gate insulating films 211 and 212 in Z direction. For example, the upper portion of the corresponding first and second spacers 231 and 232 may be at the same height as the corresponding one of the first and second dummy gate electrodes 201 and 202 in Z direction. In a similar sense to the description above, each of the L-shape of the first and second spacers 231 or 232 may have a greater width at its bottom portion contacting the fin-type pattern F1 than its upper portion, e.g., a portion correspondingly contacting the first and second dummy gate electrodes 201 and 202.

In the method of fabricating the semiconductor device according to some exemplary embodiments, the first spacer 231 and the second spacer 232 may include a low-k dielectric material. The first spacer 231 and the second spacer 232 may include, for example, at least one of silicon nitride (SiN), silicon oxynitride (SiON), silicon oxide (SiO2), silicon oxycarbonitride (SiOCN), and a combination thereof. The low-k dielectric material may be a material having a lower dielectric constant than the silicon oxide.

Referring to FIG. 8, a trench T may be formed in the fin-type pattern F1.

The trench T may be formed on the side surfaces of the first dummy gate structure DG1 and the second dummy gate structure DG2. For example, the trench T may be formed between the first dummy gate structure DG1 and the second dummy gate structure DG2. Because the trench T may be formed by etching the fin-type pattern F1, the trench T may be formed lower than the positions at which the first dummy gate structure DG1 and the second dummy gate structure DG2 are formed. For example, the bottom surface of the trench T may be lower that the top surface of the fin-type pattern F1, on which at least one of the first and second dummy gate structures DG1 and DG2 are formed.

The trench T may be formed within the fin-type pattern F1 by using the first dummy gate structure DG1, the second dummy gate structure DG2, the first spacer 231 and the second spacer 232 as etch masks. For example, the trench T may be formed on a portion of the fin-type pattern F1 where the first dummy gate structure DG1, the second dummy gate structure DG2, the first spacer 231 and the second spacer 232 are not formed.

A plurality of processes may be included in the process of forming the trench T. These plurality of processes may include a process of forming a depth of the trench T, and a process of forming a width of the trench T. Due to the process of forming a width of the trench T, a width of the trench T may be broader than a distance between the first spacer 231 and the second spacer 232 which are adjacent to each other. For example, the trench T may overlap the first spacer 231 and/or the second spacer 232 in a vertical direction, e.g., in a third direction Z. However, exemplary embodiments are not limited to the example given above.

Referring to FIG. 9, an impurity or an unintended material 50, e.g., contamination, may be diffused into the trench T. For example, unintended particles 50 may be introduced on the surface of the trench T. For example, the unintended particles or material 50 may be introduced as a side effect of a process of manufacturing a semiconductor device.

For example, the impurity or unintended material 50 may be diffused from the first spacer 231 and/or the second spacer 232 into the trench T. The impurity or unintended material 50 may migrate to an inner wall of the trench T, e.g., to a sidewall and a bottom surface of the trench T. The impurity or unintended material 50 may be formed or attached on the inner wall of the trench T discontinuously, e.g., randomly.

The impurity or unintended material 50 may include carbon. However, exemplary embodiments are not limited to the example given above. When the impurity or unintended material 50 includes carbon, the impurity or unintended material 50 may be present in a $Si_xC_yO_z$ form on a surface of the silicon fin-type pattern F1 and/or the trench T. However, exemplary embodiments are not limited to the example given above.

A process of removing a parasitic capacitance by lowering dielectric constants of the first spacer 231 and the second spacer 232 may be performed. The process of removing a parasitic capacitance may cause an increase of carbon component within films of the first spacer 231 and the second spacer 232. Accordingly, the $Si_xC_yO_z$ form of the impurity or unintended material 50 as mentioned above may further be increased on the surface of the trench T.

The more such impurity or unintended material 50 there is, the more deterioration may occur in a subsequent process, e.g., a process of epitaxially-growing the source/drain material within the trench T, in terms of efficiency. Such reduction of the efficiency may cause a problem in the performance of semiconductor devices because the 'less defect' may be generated or appear in the source/drain pattern.

Accordingly, in order to prevent or reduce such less defect, applying a process of removing the impurity or unintended material 50 may be helpful.

Figure 11:
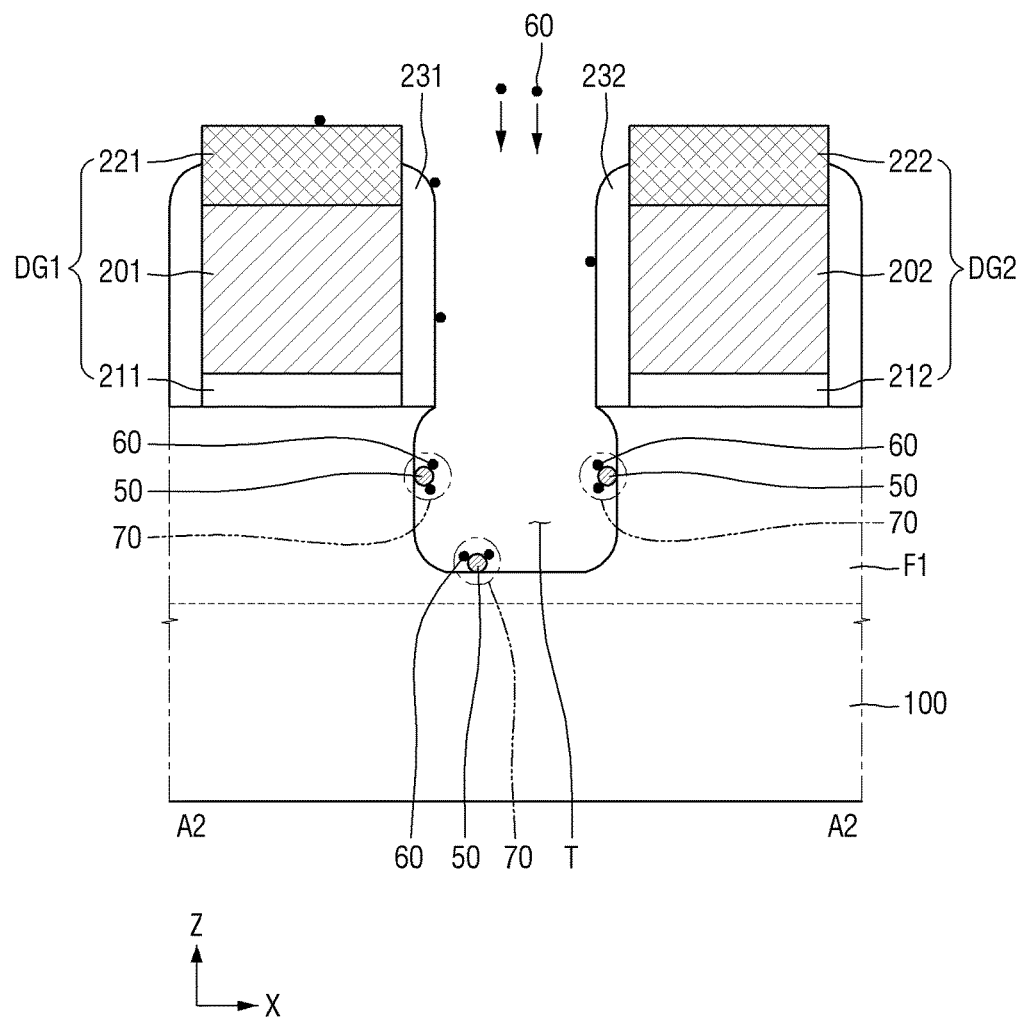
Figure 12:
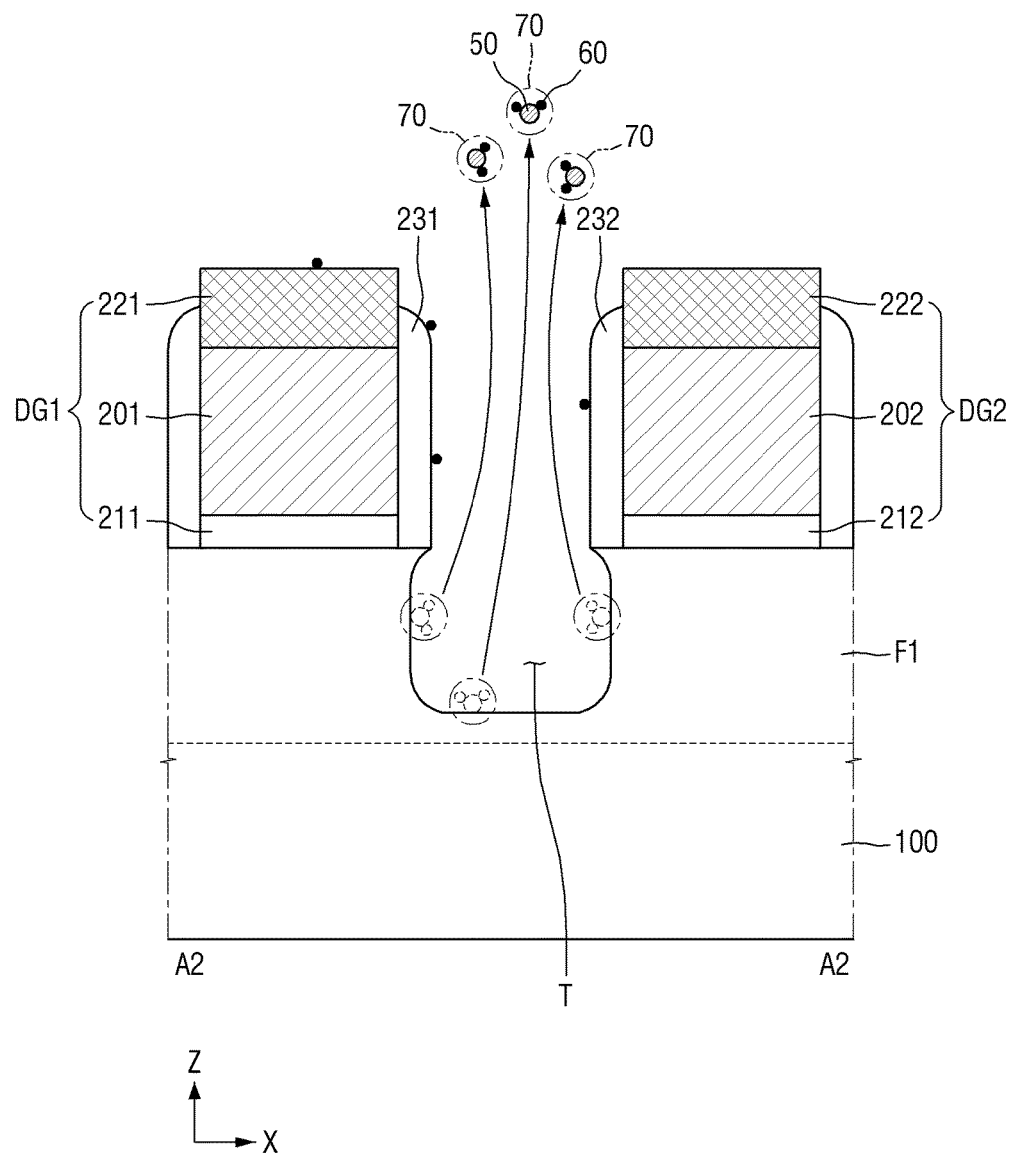

Referring to FIGS. 10 to 12, the bake process may be performed.

FIG. 10 is a graphical representation illustrating changes of pressure over bake processing time, and FIG. 11 is a cross sectional view provided to explain the first section P1 of FIG. 10. FIG. 12 is a cross sectional view provided to explain the second section P2 of FIG. 10.

The bake process may include two sections. For example, the bake process may include the first section P1 and the second section P2. The first section P1 may have a first pressure, and the second section P2 may have a second pressure lower than the first pressure. For example, the bake process may be a pre-bake process performed immediately before an epitaxial growth process of a source/drain material in a semiconductor device manufacturing method.

The bake process may be performed by using $H_2$ gas. The bake process may be the process of removing the impurity or unintended material 50 of FIG. 9 by exerting certain pressure and temperature while $H_2$ gas is supplied. Herein, a temperature of the bake process may be in a range of 500° C. to 1000° C., but not limited hereto.

For example, referring to FIG. 11, the supply gas 60, e.g., $H_2$ gas, may be provided to the trench T in the first section P1. The supply gas 60 may be combined with the impurity or unintended material 50 to form a product 70. For example, reactants supply gas 60 and unintended material 50 may react to form a product 70.

The supply gas 60 may be $H_2$ gas, as described above. The supply gas 60 may perform a reaction generating the product 70 with the following chemical formula.

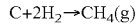
$$C + 2H_2 \rightarrow CH_4(g) \qquad \text{[Chemical formula 1]}$$

For example, the product 70 of $CH_4$ may be formed by the reaction of the reactants, e.g., carbon C within the impurity or unintended material 50 and the supply gas 60 ($H_2$). The product 70 may be a matter of a gaseous form. For example, the product 70 may additionally include $O_2$ and $H_2O$.

Next, referring to FIG. 12, the product 70 may be removed in the second section P2. Because the product 70 is a gaseous form, it may not remain on a surface of the trench T, but fly away from the surface of the trench T upwardly.

Referring back to FIGS. 10 to 12, the product 70 may be formed by a reaction of the reactants, e.g., supply gas 60 and the impurity or unintended material 50 in the first section P1, and the product 70 may be removed in the second section P2. For example, because the supply gas 60 is continuously provided in the second section P2, the reaction of the reactants 50 and 60 may be also performed in the second section P2, and an early formed product 70 may be removed in the first section P1.

However, a method of fabricating the semiconductor device according to some exemplary embodiments may apply a high pressure to facilitate the reaction of the reactants 50 and 60 in the first section P1, and may apply a low pressure to remove the product 70 in the second section P2. For example, the pressure of the chamber in the first section P1 may be higher than the pressure of the chamber in the second section P2, and the product 70 formed in the first section P1 may be removed in the second section P2.

Accordingly, the method of fabricating the semiconductor device according to some exemplary embodiments may facilitate reaction of the Chemical formula 1 in the first section P1 with the higher pressure. Diffusion flowrate of $H_2$ gas may be increased at the higher pressure. For example, given that aspect ratio of the semiconductor device increases, a reaction rate of the supply gas 60 with the impurity or unintended material 50 that may be positioned throughout the trench T and other structures formed on the substrate 100 may increase as the diffusion flowrate of $H_2$ gas increases.

Then, the product 70 may be easily detached with a relatively lower pressure in the second section P2 compared to the pressure of the first section P1. For example, as pressure is getting lowered, the product 70 may be more easily diffused toward outside from inside of the semiconductor device. Accordingly, the impurity or unintended material positioned on the surface of the trench T may be removed more effectively.

In this case, the pressure described above may be in a range of 1 Torr-760 Torr, but is not limited hereto.

Next, the epitaxial growth of the source/drain may be performed in a growth section Pg. Because the impurity or unintended material 50 is effectively removed in the first section P1 and the second section P2, efficiency of the epitaxial growth in the growth section Pg may be increased, and the less defect, which is an insufficient growth, may be improved.

The following will describe a method of fabricating the semiconductor device according to some exemplary embodiments with reference to FIGS. 1 to 9, and FIGS. 11 to 18. For convenience of explanation, different aspects, portions and/or functions from the ones explained above will be mainly explained below.

Figure 13:
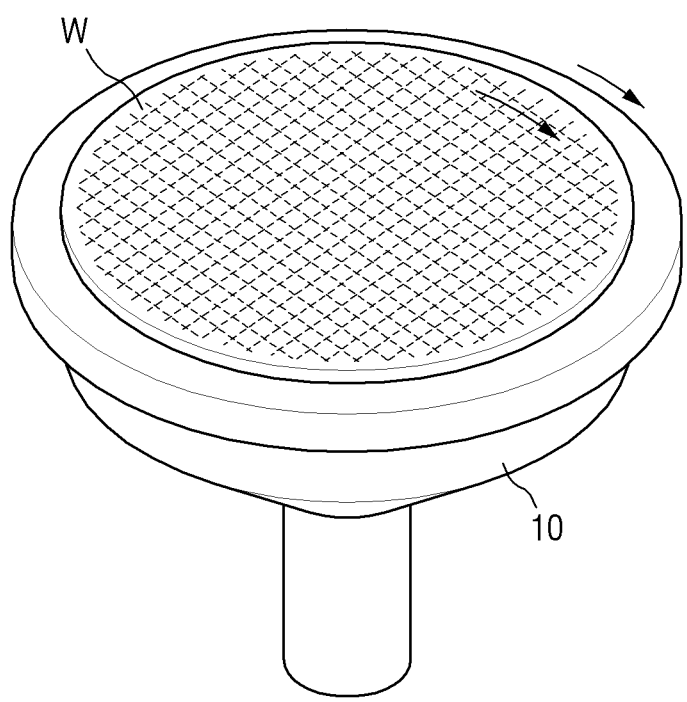
Figure 14:
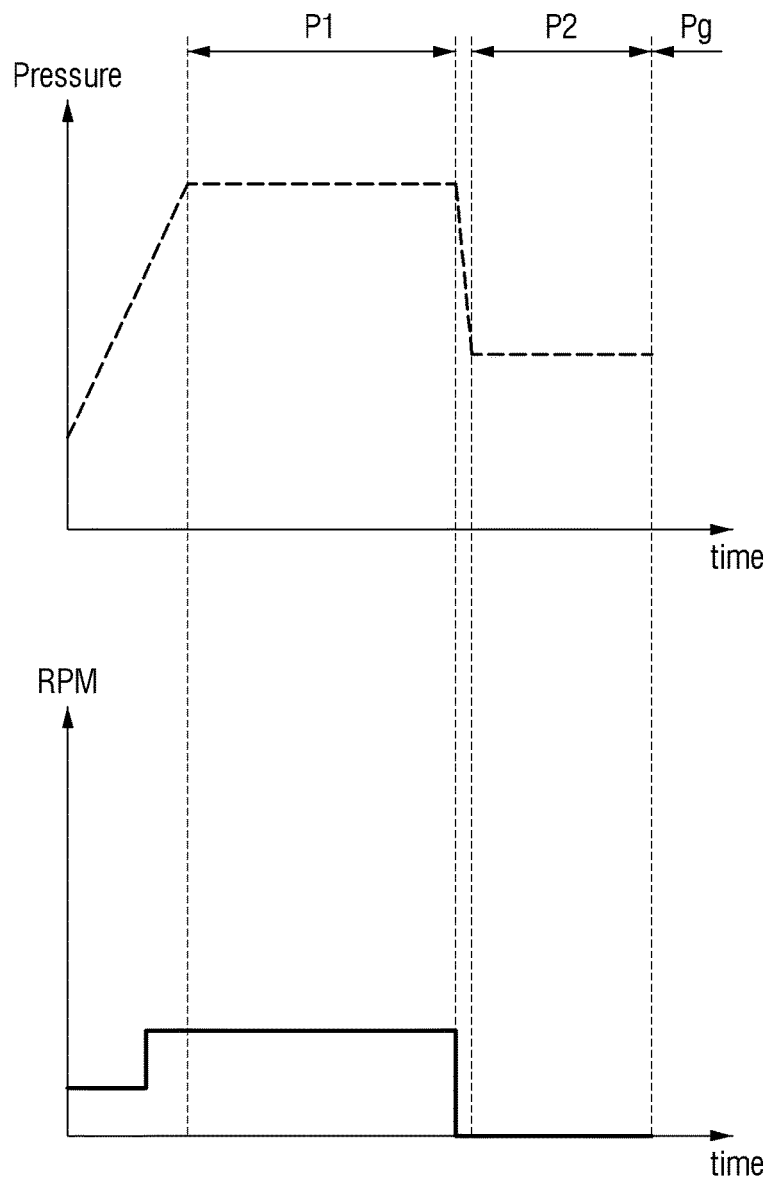
Figure 15:
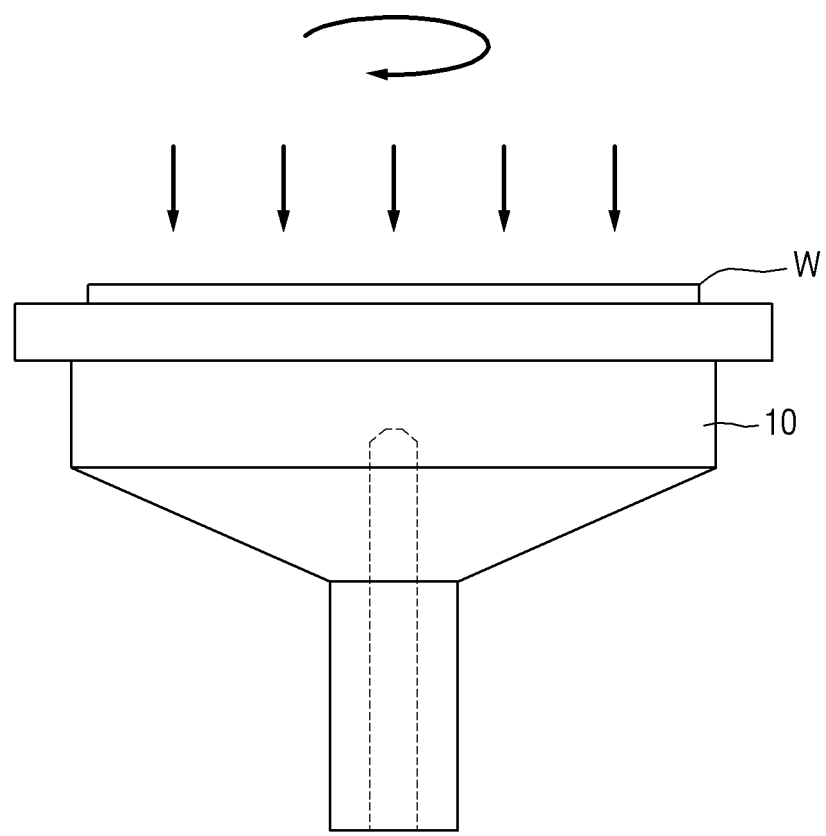
Figure 16:
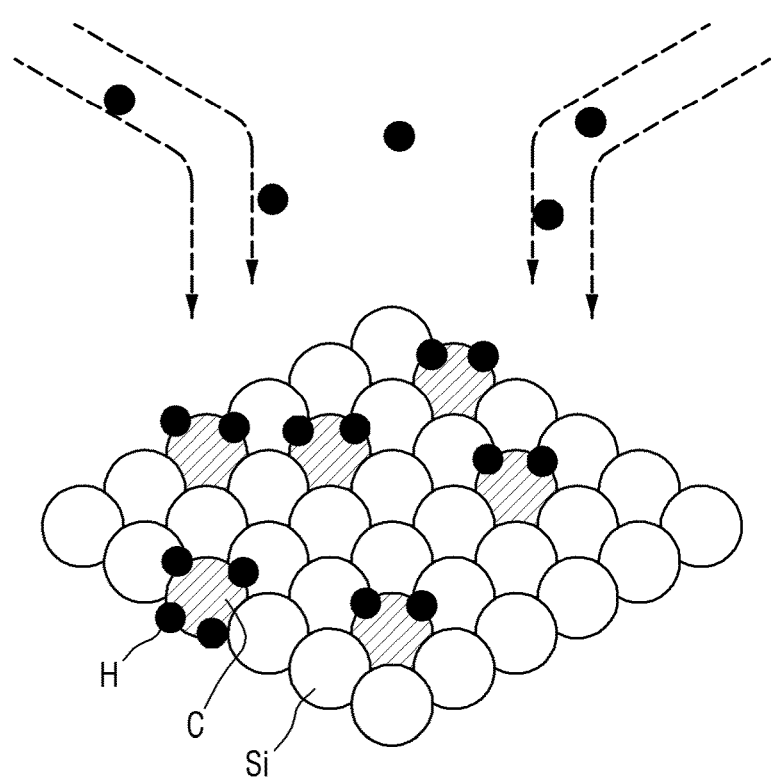
Figure 17:
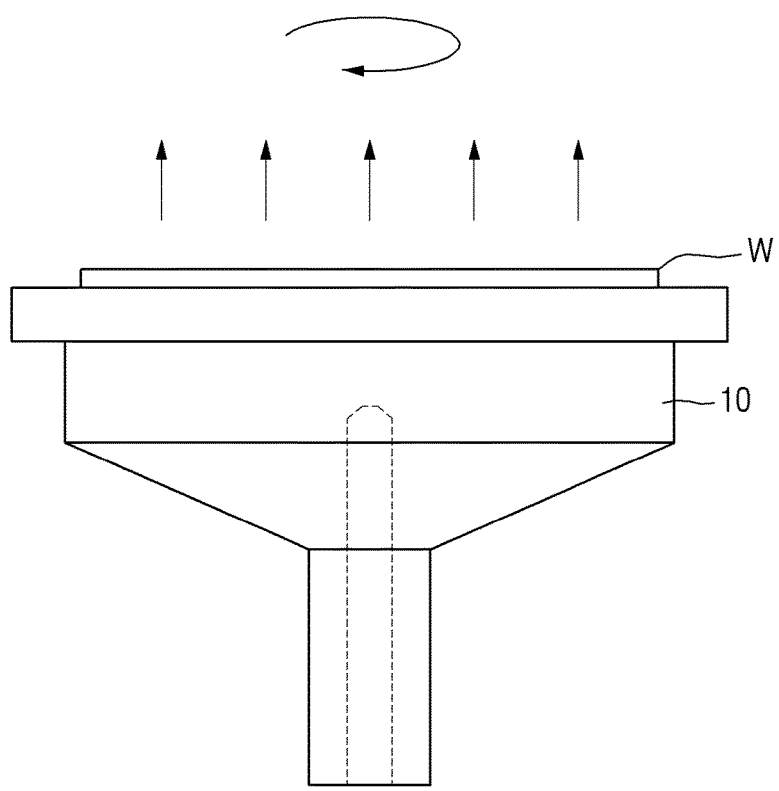
Figure 18:
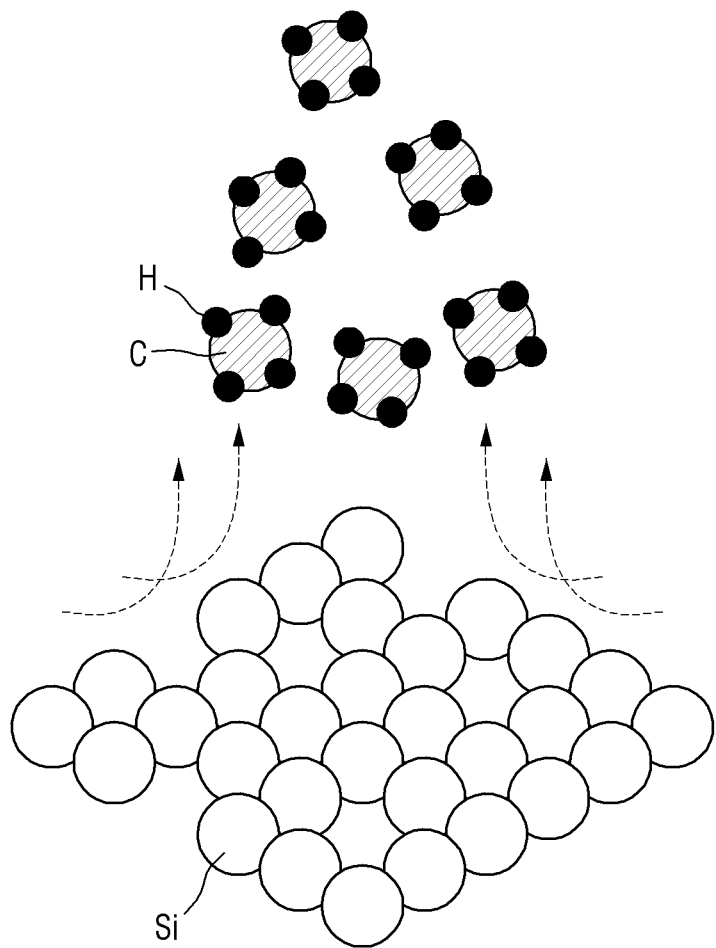

FIGS. 13 to 18 are views illustrating intermediate stages of fabrication, provided to explain the method of fabricating the semiconductor device according to some exemplary embodiments. For example, FIG. 14 is a graphical representation illustrating changes of pressure (upper graph) and revolution per minute (lower graph) over bake processing time. FIGS. 15 and 17 are front views provided to explain an air current or a gas flow in a processing chamber with respect to a wafer and a stage in each of the first section and the second section. FIGS. 16 and 18 are concept views provided to explain reaction of the impurity or unintended material on the wafer with the reactant gas $H_2$ respectively in the first section and the second section.

Referring to FIG. 13, the method of fabricating the semiconductor device according to some exemplary embodiments may include a wafer level fabricating process performed on the stage 10.

The wafer W may be the flat substrate 100 having a flat disc form. The semiconductor device fabricating process may include forming a pattern on the wafer substrate 100, and thereafter, separating the wafer substrate 100 into a plurality of dies through a cutting process.

The wafer W may be mounted on the stage 10 and go through a plurality of processes. The stage 10 may have a flat upper surface such that the wafer W may be mounted on the upper surface. An area of the upper surface may be sufficiently greater than an area of the wafer W.

The wafer W may be fixed onto an upper surface of the stage 10. The stage 10 may include a vacuum adsorbing configuration such as an adsorbing hole therein in order to fix the wafer W. For example, the wafer W may be fixed on the upper surface of the stage 10 by a vacuum chucking or a vacuum suction power. However, exemplary embodiments are not limited to the example given above.

The stage 10 may rotate in at least one direction. Accordingly, the wafer W mounted on the stage 10 may rotate in a same direction. The rotation may secure process uniformity in the cleaning process, the bake process, the thermal treatment process, and so on. For example, the rotation of the stage 10 and the wafer W during the processes may be beneficial for the wafer W to be treated symmetrically in left and right sides, and may also be beneficial for the treatments to be evenly processed throughout the area of the wafer W.

After the processes of FIGS. 1 to 9, the method of fabricating the semiconductor device according to some exemplary embodiments may perform the bake process.

Referring to FIG. 14, the first section P1 of the bake process, also described as a first portion or first stage of the bake process may have a first revolution per minute (RPM) and a second RPM less than the first RPM in the second section P2, also described as a second portion or second stage of the bake process. For example, RPM may be changed while the bake process is in progress. For example, when the bake process is in progress, a substantial chemical reaction may be performed yielding substantial products by reactants. Thus, the bake process in this example is not a preparation step or a wrapping up step. The preparation step may be a step preparing conditions, e.g., pressure or temperature, for a substantial process, and the wrapping up step may be a step releasing the condition, e.g., to an atmosphere condition, after the bake process.

The first RPM and the second RPM may have a range of 240 rpm~−240 rpm, but not limited hereto. Here, −240 rpm may mean an opposite direction rotation but the same revolution rate as 240 rpm.

For example, referring to FIGS. 15 and 16, when the wafer W rotates so as to have the first RPM in the first section P1 of FIG. 14, a descending air current or gas flow may be formed on an upper surface of the wafer W.

Due to the descending air current or gas flow, the supply gas 60 of FIG. 11 may be more easily reacted with the impurity or unintended material 50. For example, as the combination between carbon C and hydrogen H is facilitated, $CH_4$ gas may be formed easily. For example, the product 70 of FIG. 11 may be easily formed from the descending $H_2$ gas and carbon C disposed on silicon surface of the trench T.

Next, referring to FIGS. 17 and 18, the wafer W may be rotated to have the second RPM lower than the first RPM in the second section P2 of FIG. 14. As a result, a descending air current or gas flow slower than the descending air current or gas flow of the first section P1 or an ascending air current or gas flow may be formed on the upper surface of the wafer W.

Accordingly, $CH_4$ gas, which is previously formed in the first section P1, may be easily detached from the wafer W. As a result, the carbon impurity within the wafer W may be removed. For example, the weak descending air current or gas flow, or the ascending air current or gas flow may help the $CH_4$ gas be removed from the surface of the trench T.

Referring to FIG. 14, the method of fabricating the semiconductor device according to some exemplary embodiments may include controlling an RPM of the stage 10 and simultaneously controlling a pressure of the chamber. For example, the effects of the dual bake process may be maximized through the controlling of the RPM of the stage 10 when controlling the pressure of the chamber simultaneously.

It may be difficult to control the pressure to be a specific reference value or above the specific reference value due to limitations in the equipment hardware. In another aspect, because silicon (Si) migration phenomenon may occur when an extremely low pressure is applied, it may be difficult to control the pressure sufficiently as desired. For example, there may be limitations to reduce the pressure of the chamber because of the silicon migration and/or a low chamber performance. Accordingly, in order to overcome these limitations, RPM of the stage 10 may be additionally controlled and/or adjusted. As a result, the method of fabricating the semiconductor device according to some exemplary embodiments may include performing a more effective bake process by overcoming the limitations of equipment, increasing a reaction rate of the supply gas, and facilitating the migration of the reactant and/or the product.

The RPM in the second section P2 of FIG. 14 may be 0. For example, the stage 10 and the wafer W may not rotate in the second section P2. Accordingly, the descending air current or gas flow may turn into an ascending air current or gas flow above the wafer W or the substrate 100, and the product 70 may be easily migrated.

In certain embodiments, the method of fabricating the semiconductor device may additionally control a flowrate. For example, a flowrate of the supply gas 60, e.g., $H_2$ gas, may be relatively high in the first section P1 of FIGS. 10 and 14, and may be relatively low in the second section P2. For example, the flow rate of $H_2$ gas in the first section P1 may be higher than the flow rate of $H_2$ gas in the second section P2 of FIGS. 10 and 14.

When a flowrate of the gas 60 is high in the first section P1, the combination of the supply gas 60 and the impurity or unintended material 50 of FIG. 11 may be facilitated, and the migration of the product 70 may be accelerated when the flowrate of the gas 60 is lowered in the second section P2.

Hereinbelow, a method of fabricating a semiconductor device according to some exemplary embodiments will be described with reference to FIGS. 1 to 9, 11 to 13, and 15 to 20. For convenience of explanation, different aspects, portions and/or functions from the ones explained above will be mainly explained below.

FIGS. 19 and 20 are views illustrating intermediate stages of fabrication, provided to explain a method of fabricating a semiconductor device according to some exemplary embodiments. For example, FIG. 19 is a graphical representation illustrating changes of pressure (upper graph) and revolution per minute (lower graph) over bake processing time. FIG. 20 is a front view provided to explain air currents or gas flows over the wafer and the stage.

After the processes of FIGS. 1 to 9, the method of fabricating the semiconductor device according to some exemplary embodiments may include a step performing the bake process.

Referring to FIG. 19, the first section P1 may include a first sub-section 51 and a second sub-section S2, also referred to as first and second sub-stages.

The first sub-section 51 may be a section in which the stage 10 of FIG. 13 may rotate with the first RPM, and the second sub-section S2 may be a section in which the stage 10 of FIG. 13 may rotate with a third RPM that is greater than the first RPM.

The second section P2 may be a section in which the stage 10 of FIG. 13 may rotate with the second RPM. The second RPM may be less than the first RPM and the third RPM.

Referring to FIG. 20, while a descending air current or gas flow may be formed with the rotation of the stage 10 and the wafer W, a descending air current or gas flow at an edge portion, i.e., at an edge portion of the wafer W may be lower than the descending air current or gas flow at the center portion. This may happen because swirling may be formed as the descending air current or gas flow moves from the center portion of the wafer W to the edge portion of the wafer W.

Efficiency of the bake process at the edge portion of the wafer W may be lower than an efficiency of the bake process at the center portion of the wafer W due to such a low descending air current or gas flow at the edge portion of the wafer W. For example, efficiency of the bake process in the first section P1 may be lower in the edge portion of the wafer W compared to an efficiency of the bake process in the center portion of the wafer W.

In order to compensate above lower efficiency in the edge portion of the wafer W, the second sub-section S2 may be added in the first section P1 of FIG. 19. For example, the method of fabricating the semiconductor device according to some exemplary embodiments may compensate a relatively low reaction rate of the edge portion of the wafer W, with the relatively high RPM of the stage 10 in the second sub-section S2.

Hereinbelow, a method of fabricating the semiconductor device according to some exemplary embodiments will be described with reference to FIGS. 1, 9, 11 to 13, and 21. For convenience of explanation, different aspects, portions and/or functions from the ones explained above will be mainly explained below.

FIG. 21 is a view illustrating intermediate stages of fabrication, provided to explain the method of fabricating the semiconductor device according to some exemplary embodiments. For example, FIG. 21 is a graphical representation illustrating changes of pressure over bake processing time.

After the processes of FIGS. 1 to 9, the method of fabricating the semiconductor device according to some exemplary embodiments may perform the bake process.

Referring to FIG. 21, the bake process may include a first cycle C1 and a second cycle C2.

Explanation of the first cycle C1 may be the same as the explanation of the first section P1 and the second section P2 of FIGS. 11 and 12. The second cycle C2 may be performed continuously after the first cycle C1.

The second cycle C2 may include a third section P3 and a fourth section P4. The third section P3 may have a relatively high pressure and the fourth section P4 may have a relatively low pressure. For example, the pressure of the chamber in the third section P3 may be higher than the pressure of the chamber in the fourth section P4.

In the third section P3, the supply gas 60 may be provided to the trench T. The supply gas 60 may be combined with the impurity or unintended material 50 to form a product 70. The supply gas 60 may be $H_2$ gas, as described above.

Next, the product 70 may be removed in the fourth section P4. Because the product 70 is in a gaseous form, it may not remain on a surface of the trench T and fly away from the surface of the trench T upwardly.

For example, in the third section P3 and the fourth section P4, the same processes of the first section P1 and the second section P2 may repeat. For example, the second cycle C2 may be a repetition of the first cycle C1. However, exemplary embodiments are not limited to the example given above.

In a method of fabricating a semiconductor device according to some exemplary embodiments, the third section P3 and the first section P1 may be different from each other, and the fourth section P4 and the second section P2 may be different from each other. The expression 'different from each other' as used herein may indicate that at least one of the process time of the sections, the pressure, the RPM of the stage 10, and the flowrate of the supply gas is different from each other.

In a method of fabricating a semiconductor device according to some exemplary embodiments, rotation directions of the first cycle C1 and the second cycle C2 may be different from each other. A direction of providing $H_2$ gas, which is supply gas, may have directional components of the first direction X and the second direction Y. For example, directivity in a horizontal direction may be present. For example, according to a direction of rotation of the stage 10 and the wafer W of FIG. 13, some portions of the wafer W may be well provided with the supply gas while the other portions of the wafer W may be less provided with the supply gas.

For example, such tendency of lack of uniformity of gas supply may be particularly prominent in the recent semiconductor devices having increased aspect ratios. Accordingly, the wafer W may be rotated in a first rotating direction at the first cycle C1, and the wafer W may be rotated in a second rotating direction opposite the first rotating direction of the first cycle C1, at the second cycle C2. Therefore, efficiency of the bake process, e.g., reaction efficiency of the impurity and the supply gas and migration efficiency of the reactants 50 and 60, and/or product 70 may be maximized.

Although FIG. 21 illustrates two cycles only, exemplary embodiments of the present disclosure may not be limited hereto. For example, a method of fabricating a semiconductor device according to some exemplary embodiments may include two or more cycles.

Hereinbelow, a method of fabricating a semiconductor device according to some exemplary embodiments will be described with reference to FIGS. 1 to 25. For convenience of explanation, different aspects, portions and/or functions from the ones explained above will be mainly explained below.

FIGS. 22 to 25 are views illustrating intermediate stages of fabrication, provided to explain a method of fabricating a semiconductor device according to some exemplary embodiments.

Hereinbelow, after the process of FIG. 9 and the bake process of FIGS. 11 to 21, the method of fabricating the semiconductor device according to some exemplary embodiments may perform an additional process.

Figure 22:
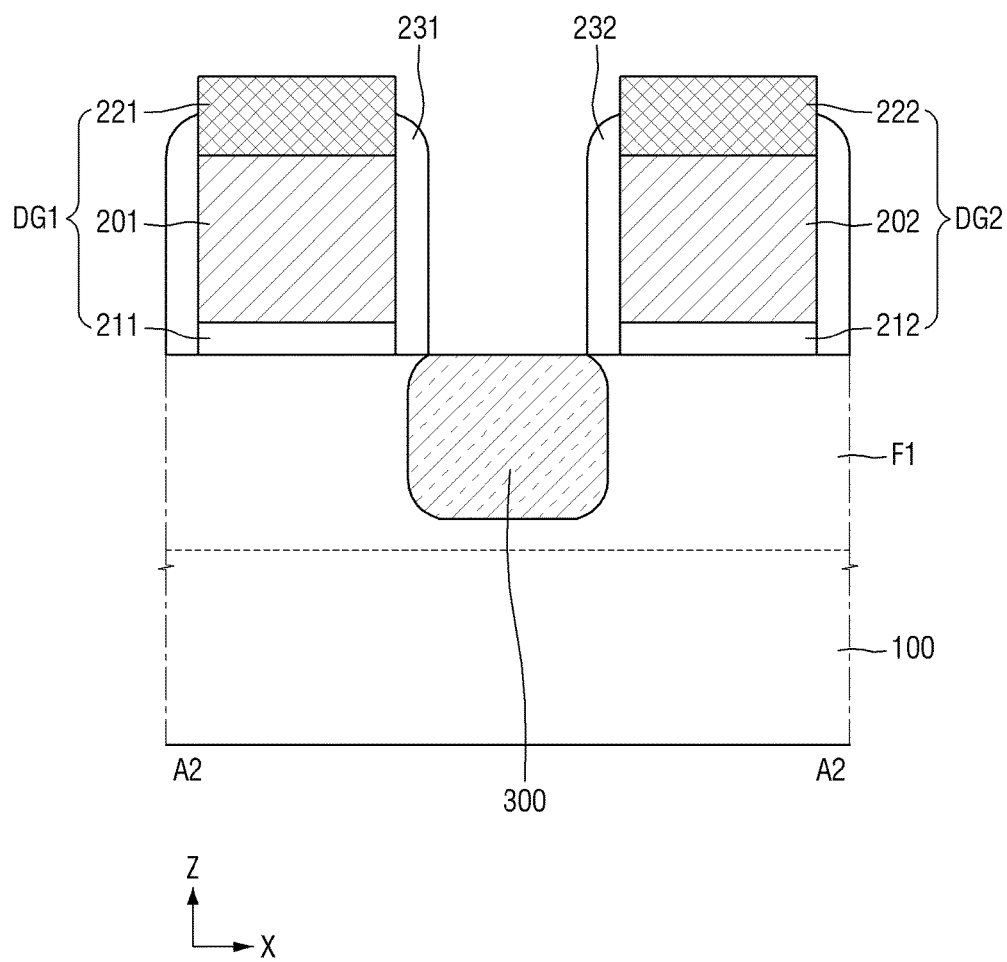

Referring to FIG. 22, the source/drain 300 may be formed to fill the trench T.

The source/drain 300 may be formed between the first dummy gate structure DG1 and the second dummy gate structure DG2. The source/drain 300 may be formed on the trench T within the fin-type pattern F1. The source/drain 300 may include an epitaxial layer formed on the upper surface of the fin-type pattern F1.

The source/drain 300 may entirely fill the trench T. With the method of fabricating the semiconductor device according to some exemplary embodiments, the source/drain 300 may have the upper surface formed beyond the trench, to a greater height than the upper surface of the fin-type pattern F1. For example, the source/drain 300 may be an 'elevated source/drain'.

An outer circumference of the source/drain 300 may take on a variety of shapes. For example, the outer circumference of the source/drain 300 may be at least one of diamond, circle, rectangle, and octagon shapes.

According to a shape of the trench T, the source/drain 300 may overlap the first spacer 231 and the second spacer 232 in the third direction Z. However, exemplary embodiments are not limited to the example given above.

The method of fabricating the semiconductor device according to some exemplary embodiments may include a step forming the source/drain in-situ following the bake process. For example, the process of forming the source/drain, e.g., epitaxial growth of the source/drain pattern, may be performed right after the bake process in the same chamber without changing the vacuum state to the atmosphere pressure state. As a result, the source/drain 300 may be formed immediately after the impurity or unintended material 50 is removed, and in a state with no other impurity added. However, exemplary embodiments are not limited hereto, and the process of forming the source/drain 300 may be performed ex-situ.

Figure 23:
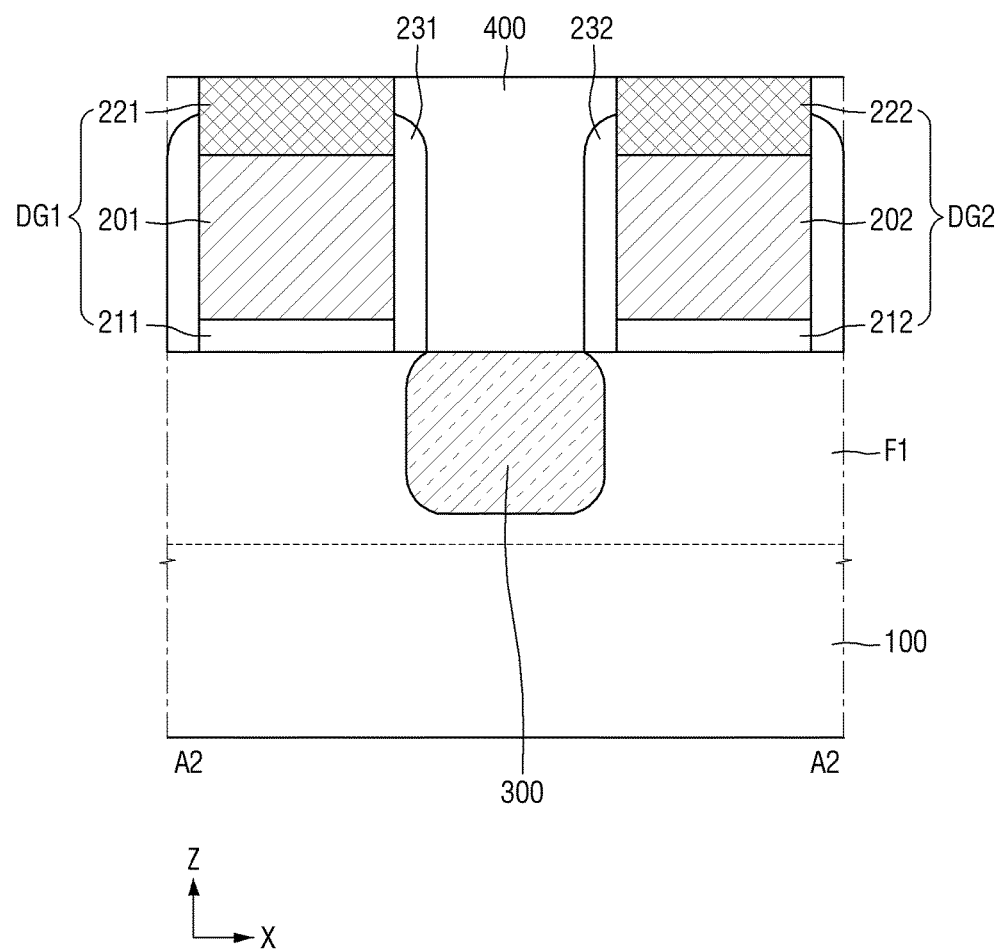

Next, referring to FIG. 23, an interlayer insulating film 400 may be formed.

The interlayer insulating film 400 may be formed on the source/drain 300, the first dummy gate structure DG1, the second dummy gate structure DG2, the first spacer 231 and the second spacer 232.

The interlayer insulating film 400 may include an electrically-insulating material in order to electrically insulate the gate structures from each other. The interlayer insulating film 400 may include at least one of low-k material, oxide film, nitride film and oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), high density plasma (HDP) oxide, plasma enhanced oxide (PEOX), flowable CVD (FCVD) oxide, or a combination thereof. However, exemplary embodiments are not limited to the example given above.

Figure 24:
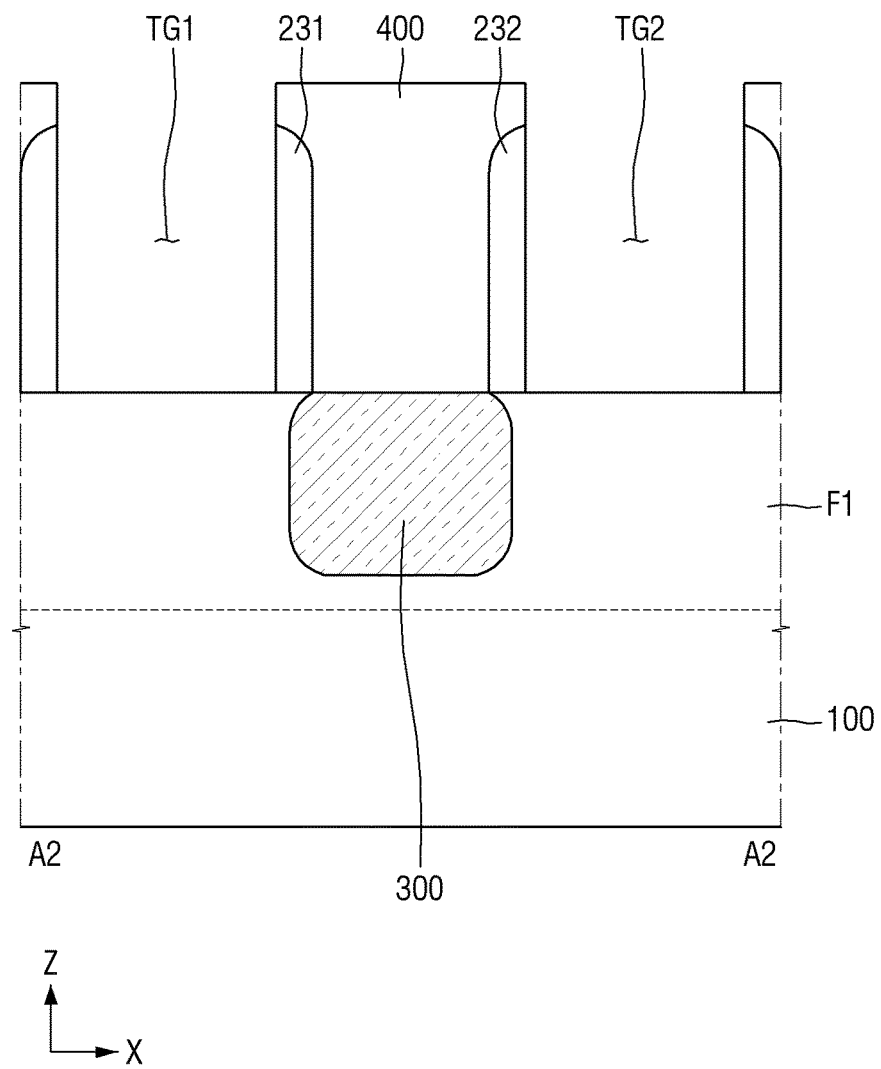

Next, referring to FIG. 24, the first dummy gate structure DG1 and the second dummy gate structure DG2 may be removed.

A first gate trench TG1 and a second gate trench TG2 may be formed as the first dummy gate structure DG1 and the second dummy gate structure DG2 are removed.

The first gate trench TG1 may be formed at a location where the first dummy gate structure DG1 was formed. The first gate trench TG1 may be formed in a space between the first spacers 231. Likewise, the second gate trench TG2 may be formed at a location where the second dummy gate structure DG2 was formed. The second gate trench TG2 may be formed in a space between the second spacers 232.

Figure 25:
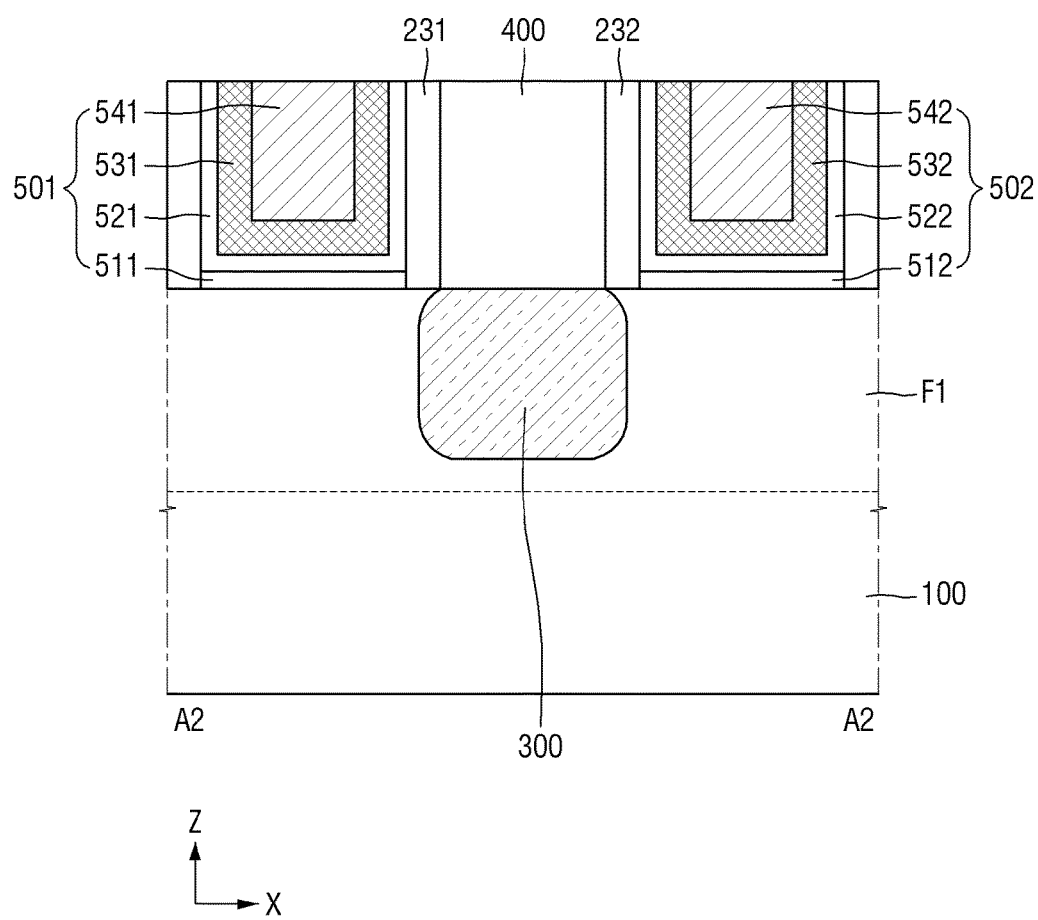

Next, referring to FIG. 25, a first gate structure 501 and a second gate structure 502 may be formed.

The first gate structure 501 and the second gate structure 502 may fill the first gate trench TG1 and the second gate trench TG2 respectively.

The first gate structure 501 may include a first interfacial layer 511, a first high-k dielectric film 521, a first work function adjustment film 531, and a first filling film 541. The second gate structure 502 may include a second interfacial layer 512, a second high-k dielectric film 522, a second work function adjustment film 532, and a second filling film 542.

The first interfacial layer 511 and the second interfacial layer 512 may be formed by oxidizing a portion of the fin-type pattern F1. The first interfacial layer 511 and the second interfacial layer 512 may be formed along the profile of the fin-type pattern F1 protruding from the substrate 100. When the fin-type pattern F1 is a silicon fin-type pattern that includes silicon, the first interfacial layer 511 and the second interfacial layer 512 may include a silicon oxide film.

The first high-k dielectric film 521 and the second high-k dielectric film 522 may be respectively formed between the first interfacial layer 511 and the first work function adjustment film 531 and between the second interfacial layer 512 and the second work function adjustment film 532. The first high-k dielectric film 521 and the second high-k dielectric film 522 may be formed along the profile of the fin-type pattern F1 protruding from the upper surface of the substrate 100.

The first high-k dielectric film 521 and the second high-k dielectric film 522 may include a high-k dielectric material having a higher dielectric constant than a silicon oxide film. For example, the first high-k dielectric film 521 and the second high-k dielectric film 522 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but not limited hereto.

The first work function adjustment film 531 and the second work function adjustment film 532 may adjust a work function, and the first filling film 541 and the second filling film 542 may fill a space formed by the first work function adjustment film 531 and the second work function adjustment film 532. The first work function adjustment film 531 and the second work function adjustment film 532 may be, for example, an N-type work function metal, a P-type work function metal, or a combination thereof.

The first work function adjustment film 531 and the second work function adjustment film 532 may include at least one of, for example, TiN, WN, TiAl, TiAlN, TaN, TiC, TaC, TaCN, TaSiN, and a combination thereof, but not limited hereto.

For example, the first filling film 541 and the second filling film 542 may include at least one of, for example, W, Al, Cu, Co, Ti, Ta, poly-Si, SiGe, and a metal alloy, but not limited hereto.

The first spacer 231, the second spacer 232, the first high-k dielectric film 521, the second high-k dielectric film 522, the first work function adjustment film 531, the second work function adjustment film 532, the first filling film 541, the second filling film 542, and the interlayer insulating film 400 may be provided with coplanar top surfaces by a planarization process. However, exemplary embodiments are not limited to the example given above. With a chamfering process, upper surfaces of the first work function adjustment film 531, the second work function adjustment film 532, the first filling film 541, and the second filling film 542 may be lowered, and a capping film, which is not illustrated, may fill the rest of the first gate trench TG1 and the second gate trench TG2.

In FIGS. 1 to 25, it is described that the gate electrode is formed through a replacement process or a gate last process, but exemplary embodiments are not limited hereto.

For example, the first dummy gate structure DG1 and the second dummy gate structure DG2 of FIGS. 1 to 9 may be used as real gates instead of the dummy gates. In this case, the subsequent process of removing the first dummy gate structure DG1 and the second dummy gate structure DG2 may be omitted.

A method of fabricating a semiconductor device according to some exemplary embodiments may accomplish an effective bake process with the processes described above. As a result, the impurity positioned on the surface of the trench may be removed efficiently, and therefore, the subsequent epitaxial growth process may be performed efficiently. For example, efficiency of the source/drain forming process in a method of fabricating a semiconductor device according to some exemplary embodiments may be highly enhanced.

While the present inventive concept has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device, the method comprising:

forming a dummy gate electrode on a substrate;

forming a trench on a side surface of the dummy gate electrode;

performing a bake process of removing an impurity from the trench; and forming a source/drain in the trench, wherein the bake process comprises a first stage and a second stage following the first stage, an air pressure in which the substrate is disposed during the first stage is different from an air pressure in which the substrate is disposed during the second stage, and the bake process is performed while the substrate is disposed on a stage rotating the substrate, wherein a revolution per minute (RPM) of the substrate during the first stage is different from a revolution per minute (RPM) of the substrate during the second stage.

2. The method of claim 1, wherein the air pressure during the first stage is greater than the air pressure during the second stage.

3. The method of claim 1, wherein the RPM of the substrate during the first stage is greater than the RPM of the substrate during the second stage.

4. The method of claim 1, wherein the bake process comprises providing $H_2$ gas, and a flowrate of the $H_2$ gas during the first stage is different from a flowrate of the $H_2$ gas during the second stage.

5. The method of claim 1, wherein the first stage comprises a first sub-stage and a second sub-stage following the first sub-stage, and the RPM of the substrate during the first sub-stage is different from the RPM of the substrate during the second sub-stage.

6. The method of claim 5, wherein the RPM of the substrate during the first sub-stage is less than the RPM of the substrate during the second sub-stage.

7. The method of claim 1, further comprising:

allowing an impurity on a surface of the trench to react with H during the first stage to thus form a product, and allowing the product to be detached from the substrate during the second stage.

8. The method of claim 7, wherein the product comprises at least one of $O_2$, $CH_4$ and $H_2O$.

9. The method of claim 7, wherein the product comprises $Si_xC_yO_z$, wherein x, y and z are natural numbers.

10. The method of claim 1, wherein the bake process comprises:

a first cycle including the first stage and the second stage; and a second cycle including a third stage and a fourth stage following the third stage, wherein an air pressure in which the substrate is disposed during the third stage is different from an air pressure in which the substrate is disposed during the fourth stage.

11. The method of claim 10, wherein a rotation direction of the substrate during the first cycle is different from a rotation direction of the substrate during the second cycle.

12. The method of claim 1, wherein the bake process and the forming the source/drain are performed in-situ.

* * * * *